US009972273B2

(12) United States Patent
Xiao et al.

(10) Patent No.: US 9,972,273 B2
(45) Date of Patent: May 15, 2018

(54) GOA CIRCUIT AND A LIQUID CRYSTAL DISPLAY

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventors: Juncheng Xiao, Guangdong (CN); Mang Zhao, Guangdong (CN)

(73) Assignees: Shenzhen China Star Optoelectronics Technology Co., Ltd, Shenzhen, Guangdong (CN); Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 251 days.

(21) Appl. No.: 14/891,646

(22) PCT Filed: Oct. 21, 2015

(86) PCT No.: PCT/CN2015/092364
§ 371 (c)(1),
(2) Date: Nov. 16, 2015

(87) PCT Pub. No.: WO2017/054264
PCT Pub. Date: Apr. 6, 2017

(65) Prior Publication Data
US 2017/0193956 A1    Jul. 6, 2017

(30) Foreign Application Priority Data

Sep. 29, 2015 (CN) .......................... 2015 1 0632682

(51) Int. Cl.
*G09G 3/36* (2006.01)
*G02F 1/1362* (2006.01)
(Continued)

(52) U.S. Cl.
CPC ......... *G09G 3/3696* (2013.01); *G02F 1/1368* (2013.01); *G02F 1/133514* (2013.01);
(Continued)

(58) Field of Classification Search
CPC ............... G09G 3/3696; G09G 3/3677; G09G 2300/0408; G09G 2310/08;
(Continued)

(56) References Cited

U.S. PATENT DOCUMENTS

| 2015/0043703 A1* | 2/2015 | Tan ......................... G11C 19/28 377/68 |
| 2015/0221265 A1* | 8/2015 | Huang .................. G09G 3/3614 345/690 |
| 2015/0255031 A1* | 9/2015 | Cao ....................... G09G 3/3648 345/210 |

* cited by examiner

*Primary Examiner* — Afroza Chowdhury
(74) *Attorney, Agent, or Firm* — Andrew C. Cheng

(57) ABSTRACT

The invention disclosure a GOA circuit and a liquid crystal display. The GOA circuit including an electrical potential pull-down controlling circuit and a plurality of GOA sub circuits in cascade connection, the electrical potential pull-down controlling circuit comprising a first voltage limited transistor, a second filter transistor and a third transistor. The first voltage limited transistor, and the second filter transistor a reconnected in series and between the output terminal of the initial scanning signal, STV signal and the control terminal of the third transistor, the control terminal of the first voltage limited transistor and the first terminal of the third transistor is connected to the first power terminal and the second terminal of the third transistor is connected to the GOA sub circuit. By this design, the damage from the large static electricity to the GOA sub circuit can be avoided.

16 Claims, 7 Drawing Sheets

(51) Int. Cl.
*G02F 1/1368* (2006.01)
*G02F 1/1335* (2006.01)

(52) U.S. Cl.
CPC ..... *G02F 1/136204* (2013.01); *G09G 3/3677* (2013.01); *G02F 2202/22* (2013.01); *G09G 2300/0408* (2013.01); *G09G 2310/08* (2013.01)

(58) Field of Classification Search
CPC ......... G02F 1/133514; G02F 1/136204; G02F 1/1368; G02F 2202/22
See application file for complete search history.

GOA CIRCUIT AND A LIQUID CRYSTAL DISPLAY

FIELD OF THE INVENTION

The present invention relates to the field of liquid crystal display technology, and in particular to a GOA circuit structure and a liquid crystal display.

BACKGROUND OF THE INVENTION

The gate driver on array (GOA) is a technology to form the gate line scanning driving signal circuit on the array substrate by the conventional process of the thin-film transistor crystal display to achieve the technology of driving method of scanning gate line by line.

With the development of the low temperature poly-silicon (LTPS) of the semiconductor thin-film transistor and the semiconductor property of the low temperature poly-silicon with super high carrier mobility, the panel corresponding peripheral integrate circuit becomes the focus of attention. The system on panel (SOP) related technology is popular and to be achieved.

When the liquid crystal display is on, an initialization operating of all gate on is introduced, to pull the voltage of all of the gate scanning signal in the GOA circuit to a low-level electrical to achieve a black state or a white state in the display and ensure the quality of the display screen. After the initialization, a normal scan operation is performed; the gate signal maintains a high-level electrical in a period.

But because of the unit of the boot strap capacitor in the input terminal of the gate signal, a question of maintain is raised.

SUMMARY OF THE INVENTION

AGOA circuit and a liquid crystal display are provided in this invention to solve the technical problem and effectively avoiding the damage from the large static electricity to the GOA sub circuit, and increase the stability of the liquid crystal display of the GOA circuit.

In order to solve the technical problem, the technical approach of this invention is: providing a GOA circuit for liquid crystal display wherein the GOA including an electrical potential pull-down controlling circuit and a plurality of GOA sub circuits in cascade connection, the electrical potential pull-down controlling circuit including a first voltage limited transistor, a second filter transistor and a third transistor, wherein the first voltage limited transistor and the second filter transistor are connected in series and between the output terminal of the initial scanning signal, STV signal and the control terminal of the third transistor, the control terminal of the first voltage limited transistor and the first terminal of the third transistor is connected to the first power terminal and the second terminal of the third transistor is connected to the GOA sub circuit.

Wherein the first terminal of the second filter transistor is separately connected to the control terminal and the output terminal of the STV signal, the second terminal of the second filter transistor is connected to the first terminal of the first voltage limited transistor, and the second terminal of the first voltage limited transistor is connected to the control terminal of the third transistor.

Wherein the first voltage limited transistor, the second filter transistor and the third transistor are PMOS transistors, the first terminal of the first voltage limited transistor is source, the second terminal is drain; the first terminal of the second filter transistor is source, the second terminal is drain; and the first terminal of the third transistor is source and the second terminal is drain.

Wherein the first voltage limited transistor, the second filter transistor and the third transistor are NTFT transistors, the first terminal of the first voltage limited transistor is drain, the second terminal is source; the first terminal of the second filter transistor is drain, the second terminal is source; and the first terminal of the third transistor is drain and the second terminal is source.

Wherein the electrical potential pull-down controlling circuit further including a fourth transistor, the first terminal of the fourth transistor is connected to the second terminal of the third transistor, the control terminal of the fourth transistor is connected to the first terminal of the fourth transistor, the second terminal of the fourth transistor is connected to the GOA sub circuit, wherein the type of the fourth transistor and the third transistor is the same.

Wherein the electrical potential pull-down controlling circuit further including a fourth transistor, the first terminal of the fourth transistor is connected to the first power terminal, the control terminal is connected to the first terminal, the second terminal is connected to the first terminal of the third transistor, wherein the type of the fourth transistor and the third transistor is the same.

Wherein the first terminal of the first voltage limited transistor is connected to the output terminal of the STV signal, the second terminal of the first voltage limited transistor is connected to the first terminal of the second filter transistor, the control terminal of the second filter transistor is connected to the first terminal of the second filter transistor, and the second terminal of the second filter transistor is connected to the control terminal of the third transistor.

Wherein the second terminal of the third transistor of the electrical potential pull-down controlling circuit is connected to the third level GOA sub circuit to the last level GOA sub circuit separately.

Wherein the GOA circuit including a plurality of the electrical potential pull-down controlling circuit, each second terminal of the third transistor of each of the electrical potential pull-down controlling circuit is connected to the third level GOA sub circuit to the last level GOA sub circuit separately.

In order to solve the technical problem, the technical approach of this invention is: providing a liquid crystal display having an array substrate, a color filter substrate and a liquid crystal layer formed between the array substrate and the color filter, wherein the array substrate having a GOA circuit. The array substrate has the GOA circuit mentioned above.

The difference with the conventional technology, the electrical potential pull-down controlling circuit of this embodiment further including a first voltage limited transistor, and a second filter transistor each connected in series. The negative static electricity of the STV signal can be filtered by the first voltage limited transistor and lower the electrical level of the negative static electricity. The positive static electricity of the STV signal can be filtered by the second filter transistor. By the accompanying of the first voltage limited transistor, and the second filter transistor, the voltage into the gate of the third transistor is lower to effectively avoid the damage to the third transistor from the large static electricity from the STV signal, and avoid the damage to the GOA sub circuit from the large static electricity from the STV signal through the third transistor to the GOA sub circuit, and increase the stability of the GOA circuit.

BRIEF DESCRIPTION OF THE DRAWINGS

The following detailed descriptions accompanying drawings and the embodiment of the present invention make the aspect of the present invention and the other beneficial effect more obvious.

DETAILED DESCRIPTION OF THE PREFERRED EMBODIMENTS

The specific components or items are used in the specification and claims. Those skilled in the art can use other possible modifications and variations in the same components or items. The specification and claim will not distinguish the different terms to the items or components but by the functions. Following is the detail description illustrated by the figures and the embodiments.

Figure 1:
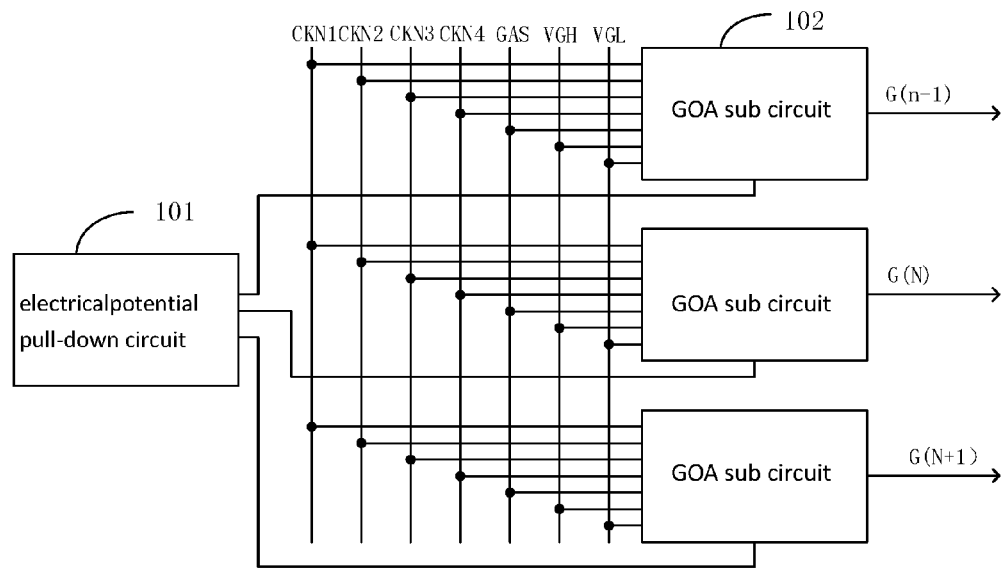
FIG. 1 is a schematic view illustrating a plurality of the GOA sub circuit in cascade connection of the GOA circuit structure according to the first embodiment of the present invention.

In order to solve the problem of maintain the GOA circuit; a GOA circuit is presented in this invention. As illustrated in FIG. 1, FIG. 1 is a schematic view illustrating a plurality of the GOA sub circuit in cascade connection of the GOA circuit structure according to the first embodiment of the present invention. The GOA circuit of this invention includes an electrical potential pull-down circuit 101 and a plurality of the GOA sub circuit 102 in cascade connection.

Figure 2:
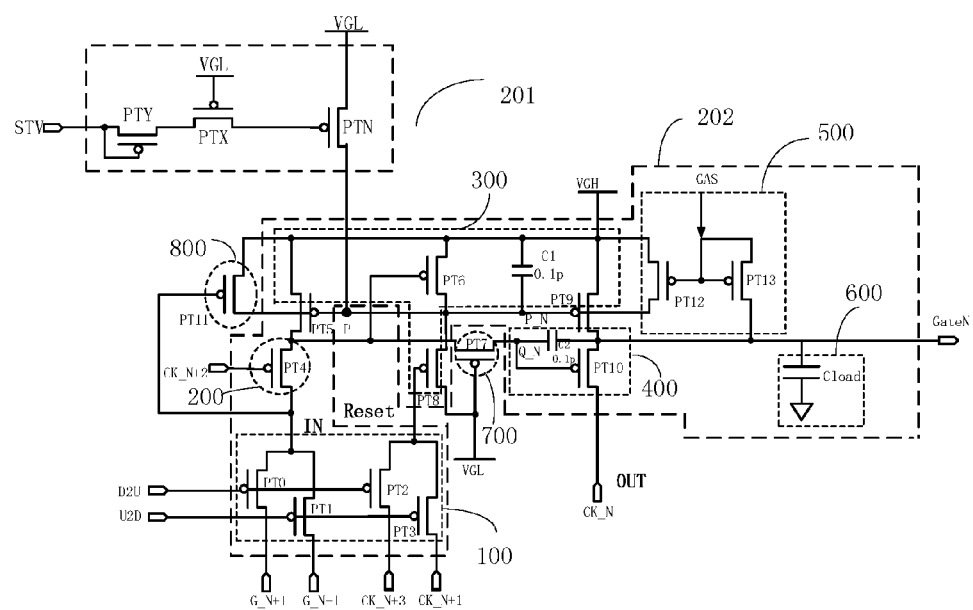
FIG. 2 is a specific connection of the GOA circuit structure according to the first embodiment of the present invention.

In the embodiment, the electrical potential pull-down circuit 101 is connected to the third level GOA sub circuit to the last level GOA sub circuit separately. Referring to FIG. 2, FIG. 2 is a specific connection of the GOA circuit structure according to the first embodiment of the present invention. The GOA sub circuit is included each of the GOA sub circuit from the third level GOA sub circuit to the last level GOA sub circuit and is not limited.

As illustrated in FIG. 2, the electrical potential pull-down circuit 201 includes a transistor PTN, the GOA sub circuit 202 includes a bilateral scanning unit 100, an input controlling unit 200, a pull-up maintaining unit 300, an output control unit 400, a GAS signalization unit 500 and a bootstrap capacitor 600. The bilateral scanning unit 100 is connected to the pull-up maintaining unit 300 and the input controlling unit 200 separately. The GAS signalization unit 500 is connected to the pull-up maintaining unit 300 and the connection point is a common signal point P. Taking the GOA circuit is a PMOS circuit as an example, the transistor PTN is a PMOS transistor, the drain of the transistor PTN is connected to the common signal point P, the gate control terminal of the transistor PTN is connected to the STV signal terminal, the source of the transistor PTN is connected to the power control terminal.

Wherein the bilateral scanning unit 100 is used to control the forward driving and the reverse driving of the GOA circuit including a fifth transistor PT0, a sixth transistor PT1, a seventh transistor PT2, and an eighth transistor PT3. A reverse driving control signal is receive by the gate of the fifth transistor PT0, the source of the fifth transistor PT0 receive agate driving signal output from the GATE terminal of the N+1 level GOA sub circuit G_N+1. A forward driving control signal is receive by the gate of the sixth transistor PT1, the source of the sixth transistor PT1 receive a gate driving signal output from the GATE terminal of the N−1 level GOA sub circuit G_N−1. The drain of the fifth transistor PT0 and the sixth transistor PT1 is connected and further connected to the input controlling unit 200. A reverse driving control signal is receive by the gate of the seventh transistor PT2, the source of the seventh transistor PT2 receive a first clock control signal CK_N+3. A forward driving control signal is receive by the gate of the eighth transistor PT3, the source of the eighth transistor PT3 receive a second clock control signal CK_N+1. The drain of the seventh transistor PT2 and the eighth transistor PT3 is connected and further connected to the pull-up maintaining unit 300.

The input controlling unit 200 charges the gate signal point by control the input of the level signal according to the level of the clock control signal and includes a ninth transistor PT4, a first cascade clock signal CK_N+2 is receive by the gate of the ninth transistor PT4, the source of the ninth transistor PT4 is connected to the drains of the fifth transistor PT0 and the sixth transistor PT1 separately, and the drain of the ninth transistor PT4 is connected to the gate signal point.

The pull-up maintaining unit 300 maintains the predetermined electrical level such as an invalid electrical level in a non-operation period according to the common signal point P to control the gate point, and it includes a tenth transistor PT5, an eleventh transistor TP6, a twelfth transistor TP8, a thirteenth transistor TP9 and a first capacity C1. The gate of the tenth transistor PT5 is connected to the common signal point P, the source of the tenth transistor PT5 is connected to the drain of the ninth transistor PT4, the drain of the tenth transistor PT5 is connected to the second power source VGH, the gate of the eleventh transistor TP6 is connected to the drain of the ninth transistor PT4, the source of the eleventh transistor PT6 is connected to the common signal point P, the drain of the eleventh transistor PT6 is connected to the second power source VGH, the gate of the twelfth transistor TP8 is connected to the drain of the seventh transistor PT2 and the eighth transistor PT3, the source of the twelfth transistor TP8 is connected to the first power source VGL, the drain of the twelfth transistor TP8 is connected to the common signal point P, the gate of the thirteenth transistor TP9 is connected to the common signal point P, the source of the thirteenth transistor TP9 is connected to the GATE terminal, the drain of the thirteenth transistor TP9 is connected to the second power source VGH, one terminal of the first capacity C1 is connected to the second power source VGH and the other terminal of the first capacity C1 is connected to the common signal point P.

The output control unit 400 controls the outputting of the gate signal point according to the control of the level of the clock control signal and the gate signal point include a fourteenth transistor PT10 and a second capacity C2. The gate of the fourteenth transistor PT10 is connected to the gate signal point, the drain of the fourteenth transistor PT10 is connected to the GATE terminal, the source of the fourteenth transistor PT10 received the second level clock signal CK_N, one terminal of the second capacity C2 is connected to the gate signal point and the other terminal of the second capacity C2 is connected to the GATE terminal.

The GAS signalization unit 500 controls the gate driving signal in a valid electrical level and achieves the charge of horizontal scanning line of the GOA circuit, and includes a fifteenth transistor PT12, a sixteenth transistor PT13. The gate of the fifteenth transistor PT12 and the gate and the drain of the sixteenth transistor PT13 receive the GAS signal, the drain of the fifteenth transistor PT12 is connected to the second power source VGH, the source of the fifteenth transistor PT12 is connected to the common signal point P, the drain of the sixteenth transistor PT13 is connected to the GATE terminal.

The bootstrap capacitor unit 600 further raise the voltage of the gate signal point and includes a bootstrap capacitor Cloud, one terminal of the bootstrap capacitor Cloud is connected to the GATE terminal, and the other terminal of the bootstrap capacitor Cloud is connected to the ground.

In a preferred embodiment, the GOA sub circuit further includes a voltage stabilizer unit 700 to achieve the voltage stabilize of the gate signal point and prevent the leakage of the gate signal point. More specifically, the voltage stabilizer unit 700 includes a seventeenth transistor PT7 and the seventeenth transistor PT7 is connected between the source of the ninth transistor PT4 and the gate signal point, the gate of the seventeenth transistor PT7 is connected to the negative and constant voltage source, the drain of the seventeenth transistor PT7 is connected to the drain of the drain of the ninth transistor PT4, the source of the seventeenth transistor PT7 is connected to the gate signal point.

In a preferred embodiment, the GOA sub circuit further includes a pull-up assist unit 800 and to prevent the leakage of the ninth transistor PT4 and the tenth transistor PT5 in the process of charging the gate signal point. More specifically, the pull-up assist unit 800 includes a eighteenth transistor PT11, the gate of the eighteenth transistor PT11 is connected to the drain of the fifth transistor PT0, and the drain of the sixth transistor PT1, the source of the eighteenth transistor PT11 is connected to the common signal point P and the drain of the eighteenth transistor PT11 is connected to the positive and constant voltage source VGH.

More specifically, before the operation of the GAS signalization unit 500, the transistor PTN in the electrical potential pull-down circuit 101 is conducting and opens the transistor PTN by the control of the STV signal. In this period, the low electrical level signal VGL passes the source of the transistor PTN to the drain of the transistor PTN, the signal output from the drain pass to the common signal point P in the circuit to pull-down the common signal point P in the circuit and Reset the Gate signal to achieve pull-down of the electrical potential of the common signal point P and the problem is solved to the maintain of the low electrical potential caused by the presence of the bootstrap capacitor unit 600.

Figure 3:
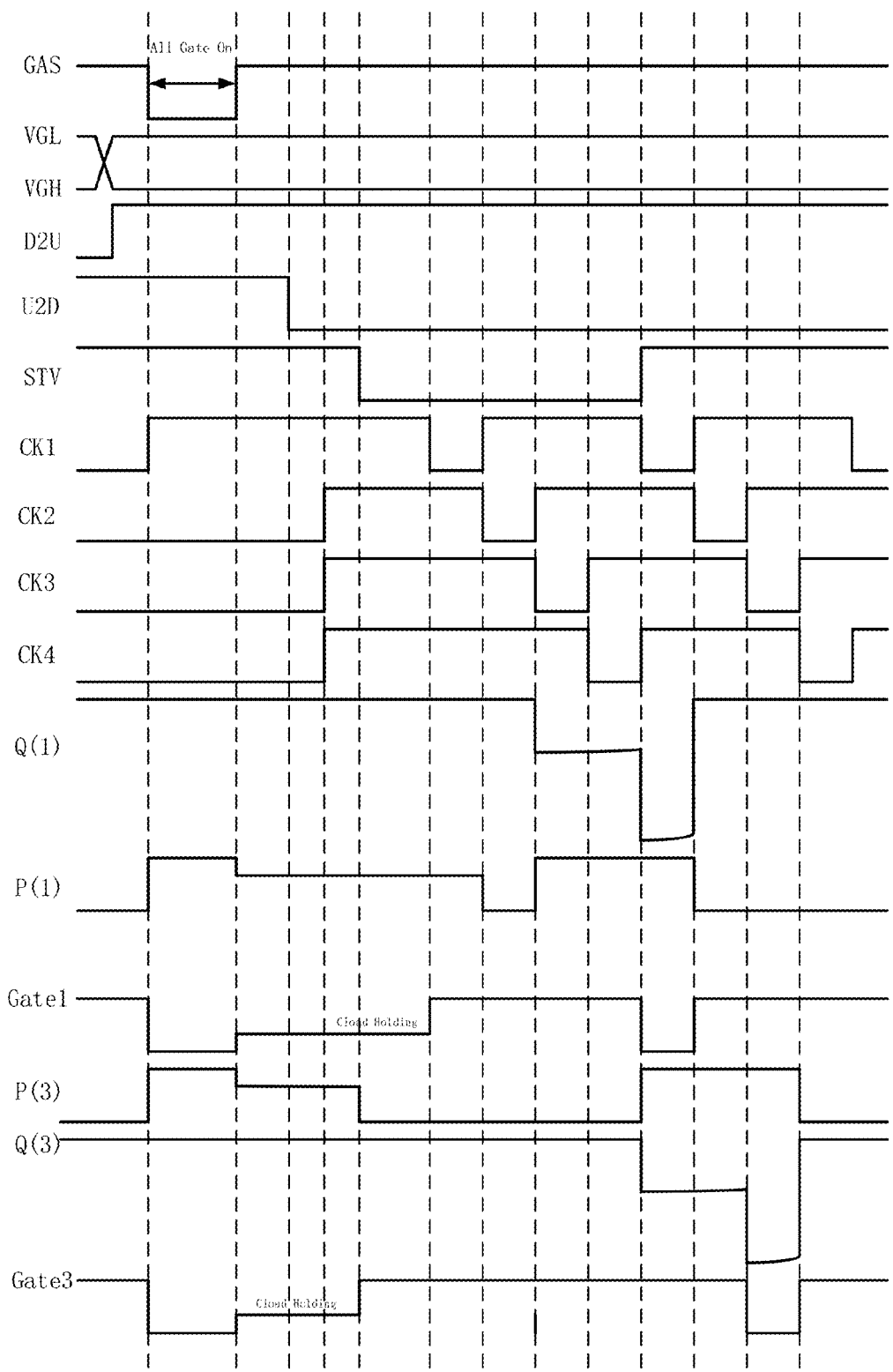
FIG. 3 is a timing diagram of the first GOA sub circuit of the GOA circuit structure according to the first embodiment of the present invention.

As illustrated in FIG. 3, FIG. 3 is a timing diagram of the first GOA sub circuit of the GOA circuit structure according to the first embodiment of the present invention. A third GOA sub circuit is an example to illustrate the embodiment by combining the FIG. 2 and the FIG. 3. When the GAS signal is valid, that is the GAS signal is a low electrical level signal, the function of the All Gate On is achieve in the GOA circuit, and the gate driving signal G(2n+1) corresponding to the odd level of the horizontal scanning line output a low electrical level signal. After the function of the All Gate On is achieved in the GOA circuit, by the presence of the bootstrap capacitor Cloud, the gate driving signal corresponding to the odd level of the horizontal scanning line will not become a high electrical level, and maintain the Cload holding low electrical level signal. When the low electrical level signal of the STV signal is come, the third level common signal point P(3) is from a high electrical level to a low electrical level signal, the GATE(3) signal is from a high electrical level to a low electrical level signal. In the meantime, the GATE(3) signal is not maintain in the low electrical level status. Since the GOA circuits in the later level is adding the same electrical potential pull-down control circuit, all gate driving signal is in the high electrical level and not influence the normal driving of the GOA circuit before the coming of the clock signal.

Besides, because the reset action from the STV signal to the common signal point P, it's no need to compensate the first cascade clock signal CK_N+1, and the second cascade clock signal CK_N in advance, and can directly control the input of the first level GOA sub circuit by the first cascade clock signal CK_N+1 and directly control the output of the first level GOA sub circuit by the second cascade clock signal CK_N. The embodiment here is illustrated but not a limitation.

Figure 4:
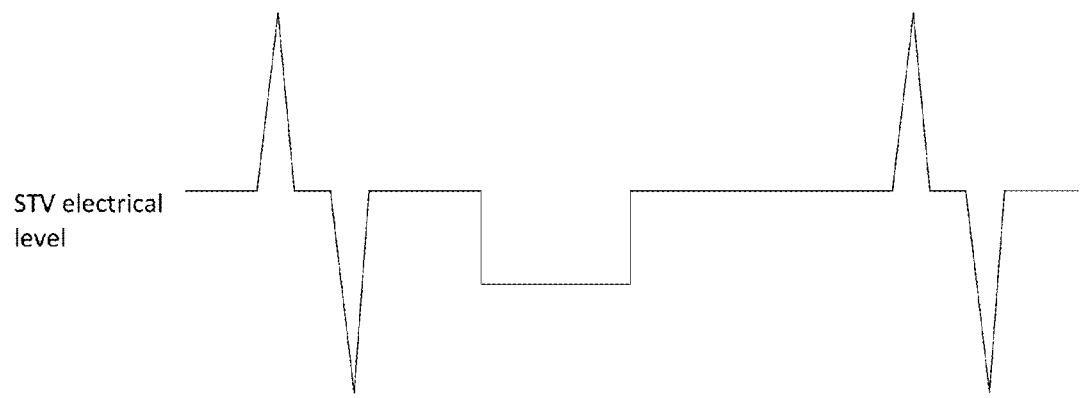
FIG. 4 illustrates the waveform of the STV signal according to the first embodiment of the present invention.

Further, since in the process of the design of the layout, the STV signal is usually in the outer side of the GOA circuit, the STV signal is easily deformed by the influence of the static electricity. As illustrated in FIG. 4, the upward positive static electricity and the downward negative static electricity of the STV signal is larger. Although the STV signal operates once in a frame, the deforming of the STV signal influences the normal display of the panel in the non-operation period. In order to solve the problem of using the circuit design of common signal point P operation unit to maintain the electrical potential and the influence of STV signal to the whole GOA circuit. Further referring to FIG. 4, except the third transistor PTN, the electrical potential pull-down circuit 201 further including a first voltage limited transistor PTX, and a second filter transistor PTY.

The first voltage limited transistor PTX and the second filter transistor PTY are connected in series and connected between the output terminal of the initial scanning signal STV and the control terminal of the third transistor PTN. More specifically, the control terminal of the first voltage limited transistor PTX is connected to the first power terminal, the first terminal of the third transistor PTN is connected to the first power terminal, the second terminal of the third transistor PTN is connected to the GOA sub circuit.

More specifically, as illustrated in FIG. 4, the first terminal of the second filter transistor PTY is connected to its control terminal and the output terminal of the STV signal. The second terminal of the second filter transistor PTY is connected to the first terminal of the first voltage limited transistor PTX, the second terminal of the first voltage limited transistor PTX is connected to the control terminal of the third transistor PTN.

Figure 5:
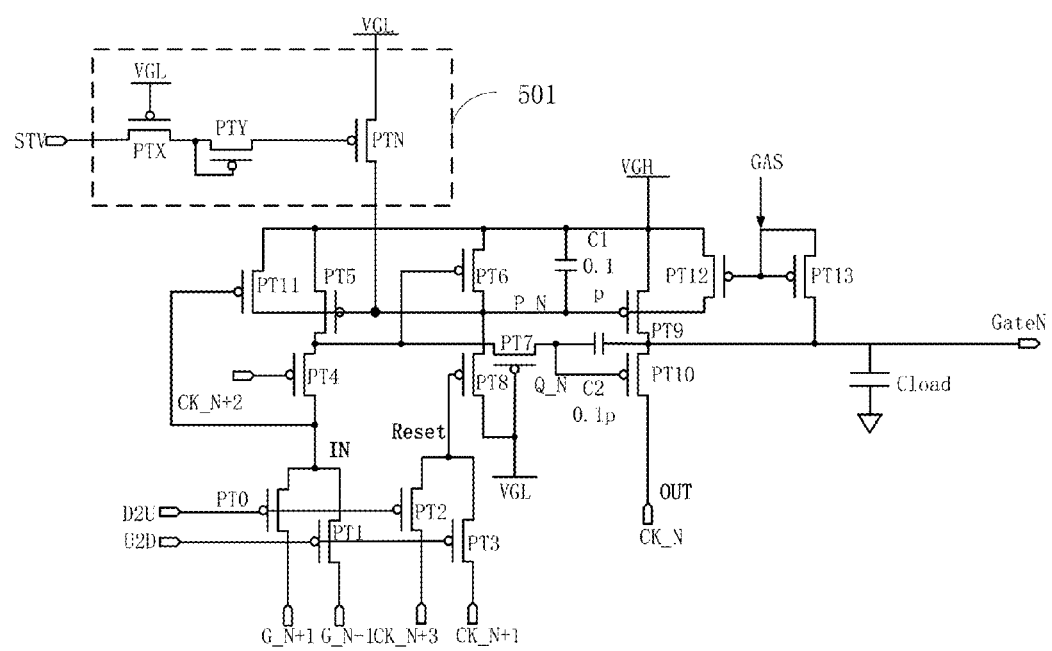
FIG. 5 is a specific connection of the GOA circuit structure according to the second embodiment of the present invention.

In another embodiment, as illustrated in FIG. 5, FIG. 5 is a specific connection of the GOA circuit structure according to the second embodiment of the present invention. The first terminal of the first voltage limited transistor PTX is connected to the output terminal of the STV signal, the first terminal and the second terminal of the first voltage limited transistor PTX is connected to the first terminal of the second filter transistor PTY, the control terminal of the second filter transistor PTY is connected to the first terminal of the second filter transistor PTY, the second terminal of the second filter transistor PTY is connected to the control terminal of the third transistor PTN.

In the two embodiments mentioned above, take GOA circuit is a PMOS circuit for example. When all of the transistors are PMOS transistors, the first terminal of the first voltage limited transistor PTX is source, the second terminal is drain. The first terminal of the second filter transistor PTY is source, the second terminal is drain. The first terminal of the third transistor PTN is source, the second terminal is drain and the first power terminal is a low electrical level signal VGL.

More specifically, when the STV signal is on, the STV signal input a low electrical level signal to the source of the second filter transistor PTY and the gate of the control terminal, by the filter of the second filter transistor PTY, the high electrical potential such as the positive static electricity signal of the STV low electrical level signal is filtered, the signal after the filtering is transmit to the source of the first voltage limited transistor PTX. In the meantime, the first power terminal connected to the gate control terminal of the first voltage limited transistor PTX is a low electrical level signal VGL. By the driving of the low electrical level signal VGL, the first voltage limited transistor PTX is open, and the voltage is limited by a predetermine voltage by the input low electrical level signal VGL by the source, the negative static electricity of the STV signal is dropped. It makes the gate voltage trough the drain of the first voltage limited transistor PTX to the gate of the control terminal of the third transistor PTN drops, and avoids the damage of the third transistor PTN under the operation of the high static electricity.

Figure 6:
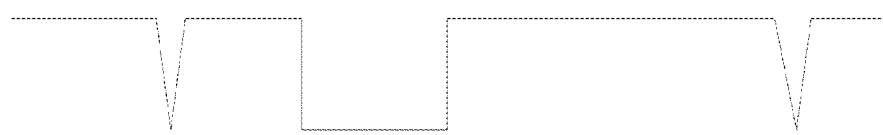
FIG. 6 illustrates the waveform of the STV signal according to the second embodiment of the present invention.

Referring to FIG. 6, FIG. 6 illustrates the waveform of the STV signal according to the second embodiment of the present invention. As illustrated in FIG. 6, the positive static electricity of the STV signal input to the PTN is totally be filtered, the negative static electricity is also be controlled in an appropriate range. By the driving of a low electrical level signal, the third transistor PTN is open, the low electrical level signal from the first power terminal is transmit from source to the drain, and the drain transmit the signal to the common signal point P of the GOA sub circuit. After the operation of the low electrical level signal of the STV signal, since the exit of the parasitic capacitance, the gate electrical potential of the third transistor PTN is maintain in a low electrical potential for keep maintaining the common signal point P. When the GOA circuit starts operating, the P point is pull-up by the GATE level signal, in this time, the high resistance of the gate of the third transistor PTN will not influence the normal operation of the GOA circuit.

Figure 7:
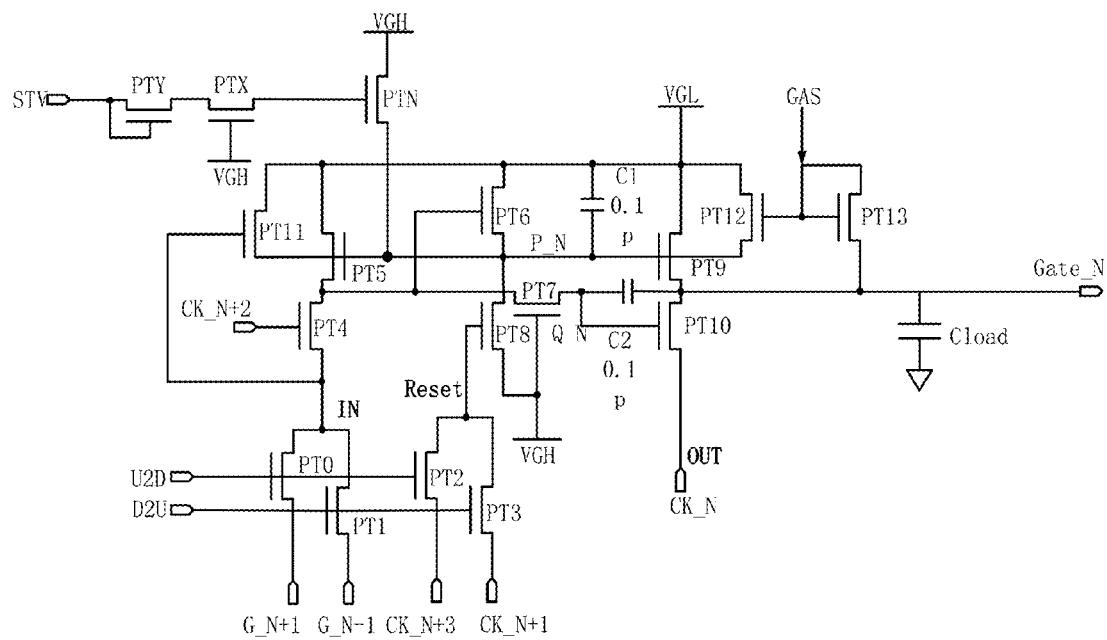
FIG. 7 is a specific connection of the GOA circuit structure according to the third embodiment of the present invention.

In other embodiments, the GOA circuit can be a NTFT circuit, which is all of the transistors in the GOA circuit are NTFT transistors. As illustrated in FIG. 7, FIG. 7 is a specific connection of the GOA circuit structure according to the third embodiment of the present invention. When the first voltage limited transistor PTX, the third transistor PTN, and the second filter transistor PTY are NTFT transistors, the first terminal of the first voltage limited transistor PTX is drain, the second terminal is source. The first terminal of the second filter transistor PTY is drain, the second terminal is source. The first terminal of the third transistor PTN is drain, the second terminal is source and the first power terminal is a high electrical level signal VGH, the second power terminal is a low electrical level signal VGL.

Figure 8:
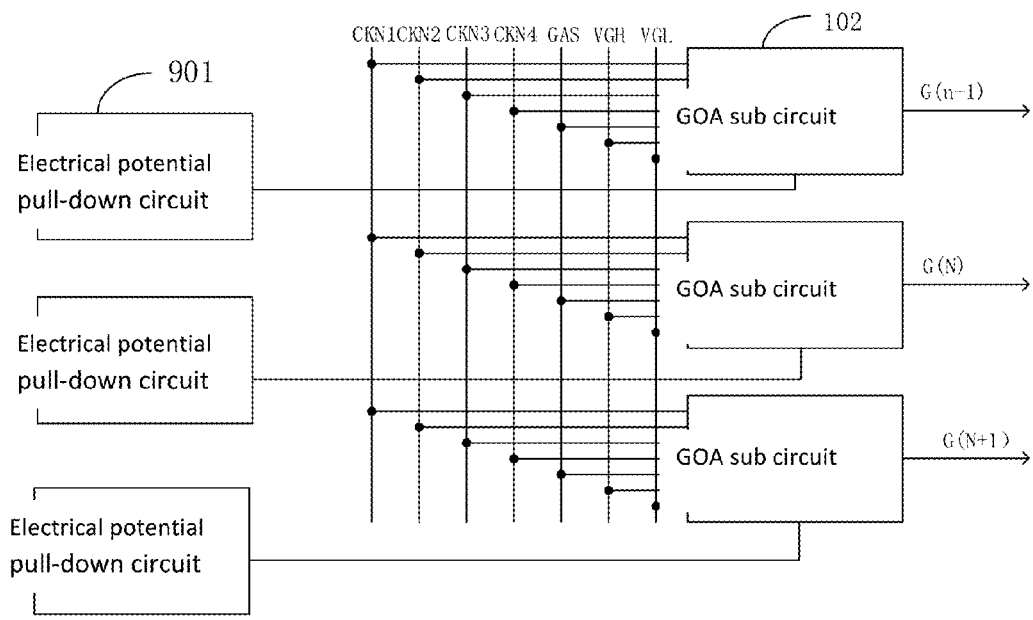
FIG. 8 is a schematic view illustrating a plurality of the GOA sub circuit in cascade connection of the GOA circuit structure according to the second embodiment of the present invention.

In another embodiment of this invention, as illustrated in FIG. 8, FIG. 8 is a schematic view illustrating a plurality of the GOA sub circuit in cascade connection of the GOA circuit structure according to the second embodiment of the present invention. A plurality of the electrical potential pull-down controlling circuit 801 is included in the GOA circuit, each of the electrical potential pull-down controlling circuit 801 is corresponding from the third level to the last level of the GOA sub circuit. More specifically, each second terminal of the third transistor PTN of the electrical potential pull-down controlling circuit 801 is corresponding from the third level to the last level of the GOA sub circuit. And not be limited in this embodiment.

Figure 9:
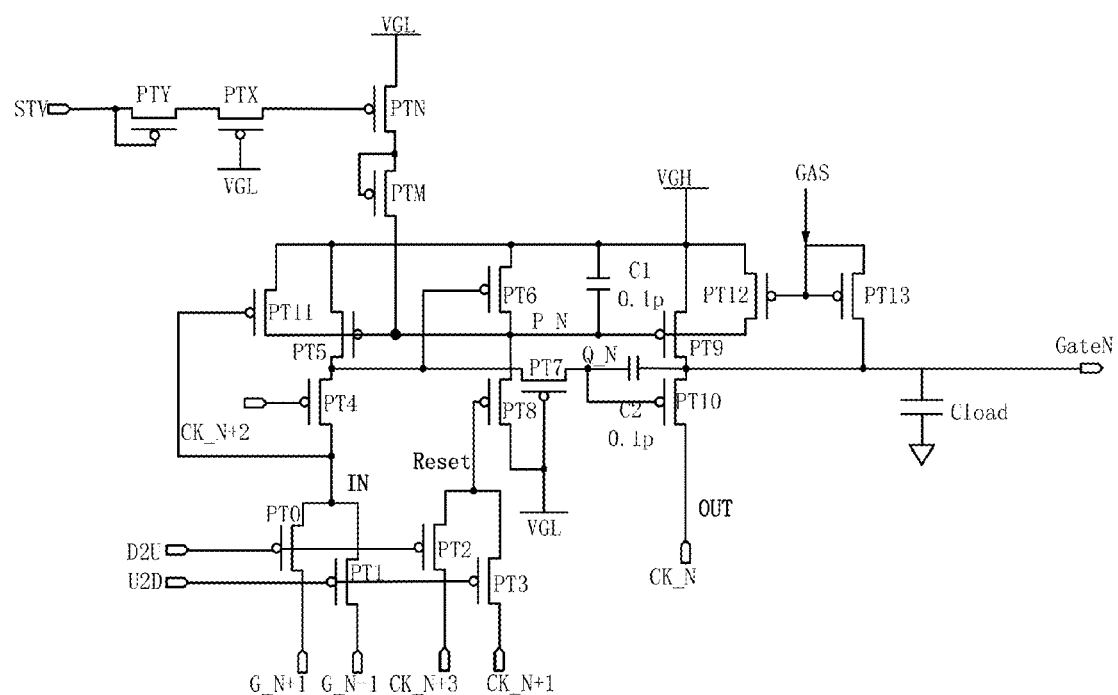
FIG. 9 is a specific connection of the GOA circuit structure according to the fourth embodiment of the present invention.

As referring to FIG. 9, FIG. 9 is a specific connection of the GOA circuit structure according to the fourth embodiment of the present invention. The difference of the GOA circuit in this embodiment and the other embodiments described above is as followed. The electrical potential pull-down circuit in this embodiment further includes a fourth transistor PTM, which the fourth transistor PTM is corresponding to the third transistor PTN to solve the problem of maintaining the electrical potential of the GOA circuit. Taking the GOA circuit is PMOS circuit as an example, the gate and the source of the fourth transistor PTM is connected to the drain of the third transistor PTN, and the drain of the fourth transistor PTM is connected to the GOA sub circuit.

Figure 10:
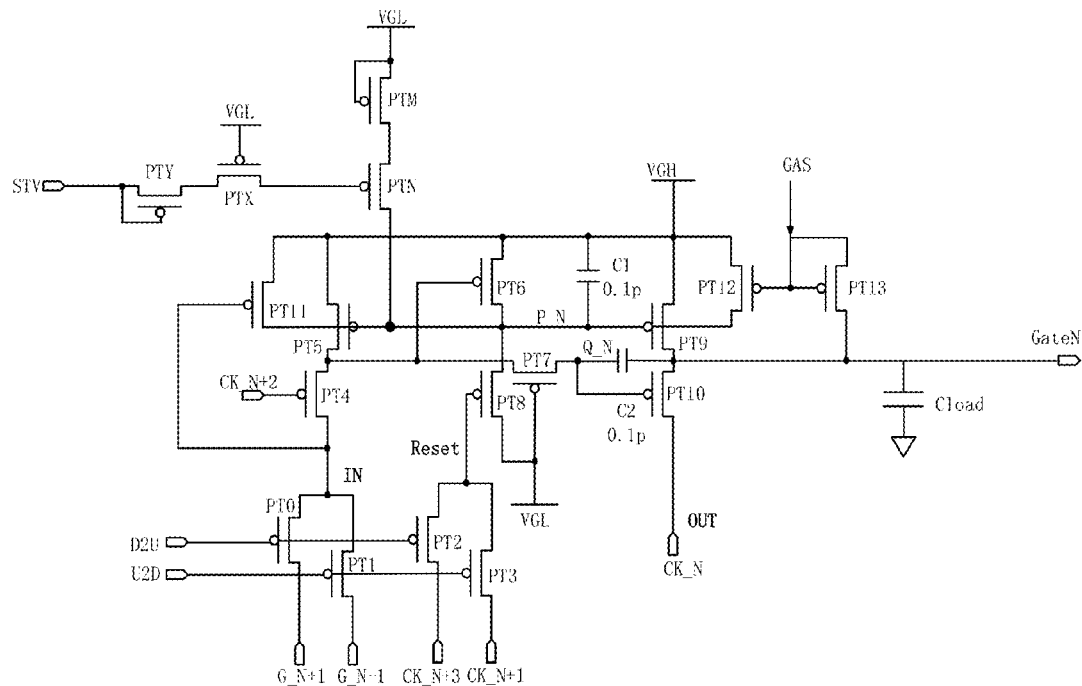
FIG. 10 is a specific connection of the GOA circuit structure according to the fifth embodiment of the present invention.

In another embodiment, as illustrated in FIG. 10, FIG. 10 is a specific connection of the GOA circuit structure according to the fifth embodiment of the present invention. Taking the GOA circuit is PMOS circuit as an example, the source of the fourth transistor PTM is connected to the first power terminal VGL, the gate control terminal is connected to the source and the drain is connected to the source of the third transistor PTN.

Figure 11:
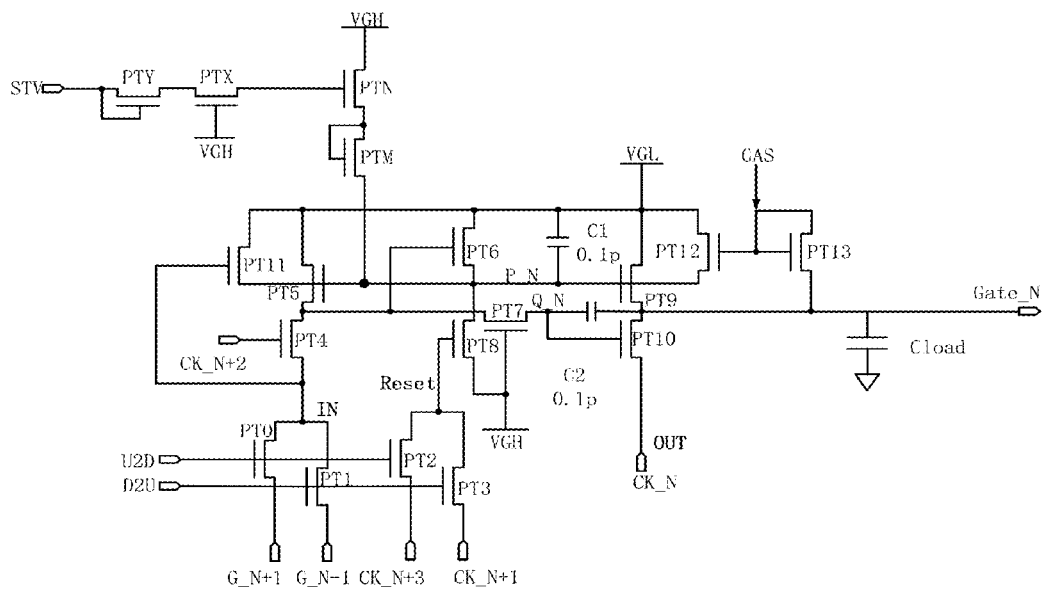
FIG. 11 is a specific connection of the GOA circuit structure according to the sixth embodiment of the present invention.
Figure 12:
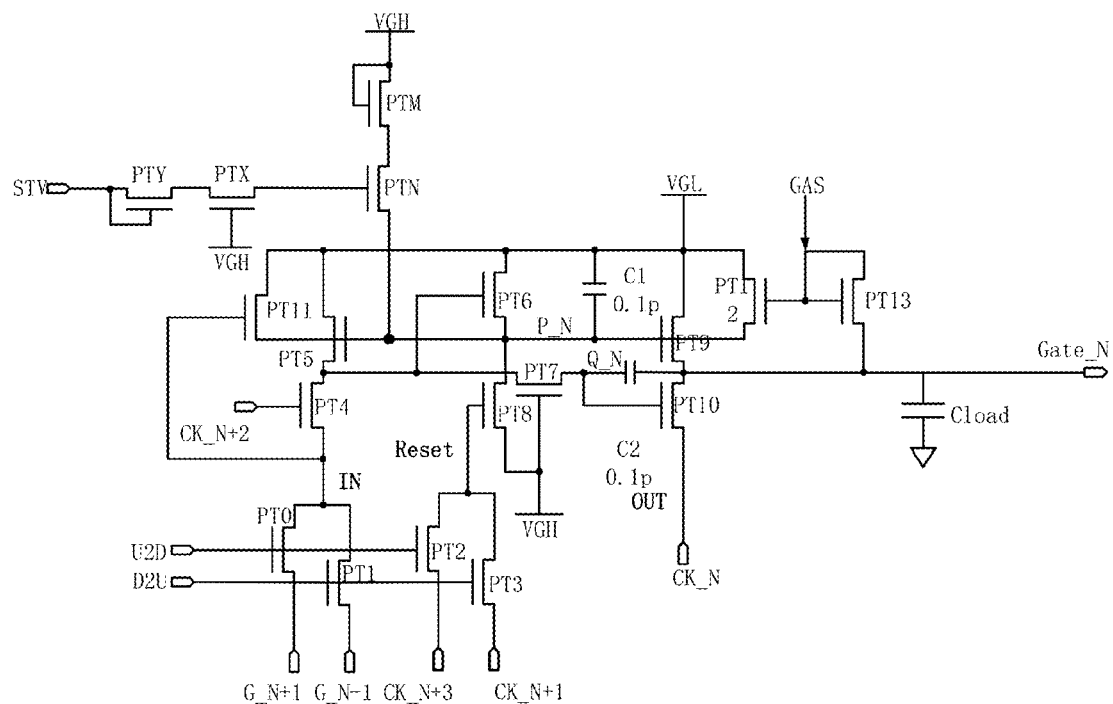
FIG. 12 is a specific connection of the GOA circuit structure according to the seventh embodiment of the present invention.

When the GOA circuit is a NTFT circuit, as illustrated in FIG. 11 and FIG. 12, FIG. 11 is a specific connection of the GOA circuit structure according to the sixth embodiment of the present invention and FIG. 12 is a specific connection of the GOA circuit structure according to the seventh embodiment of the present invention.

As illustrated in FIG. 11, FIG. 11 is a specific connection of the GOA circuit structure according to the sixth embodiment of the present invention. The drain of the fourth transistor PTM is connected to the source of the third transistor PTN, the gate is connected to the drain of the fourth transistor PTM and the source is connected to the drain of the third transistor PTN.

FIG. 12 is a specific connection of the GOA circuit structure according to the seventh embodiment of the present invention. The drain of the fourth transistor PTM is connected to the first power terminal VGH, the gate is connected to the drain, and the source is connected to the drain of the third transistor PTN.

The difference with the conventional technology, the GOA circuit of this invention further includes an electrical potential pull-down controlling circuit connected to the STV signal to pull-down the electrical potential of the common signal point P to a low electrical level when STV signal output a low electrical level signal to effectively solve the maintain problem from the two bootstrap capacitors by the operation of the GOA circuit. The electrical potential pull-down controlling circuit of this embodiment further including a first voltage limited transistor PTX, and a second filter transistor PTY each connected in series. The negative static electricity of the STV signal can be filtered by the first voltage limited transistor PTX and lower the electrical level of the negative static electricity. The positive static electricity of the STV signal can be filtered by the second filter transistor PTY. By the accompanying of the first voltage limited transistor PTX, and the second filter transistor PTY, the voltage into the gate of the third transistor PTN is lower to effectively avoid the damage to the third transistor PTN from the large static electricity from the STV signal, and avoid the damage to the GOA sub circuit from the large static electricity from the STV signal through the third transistor PTN to the GOA sub circuit, and increase the stability of the GOA circuit.

Figure 13:
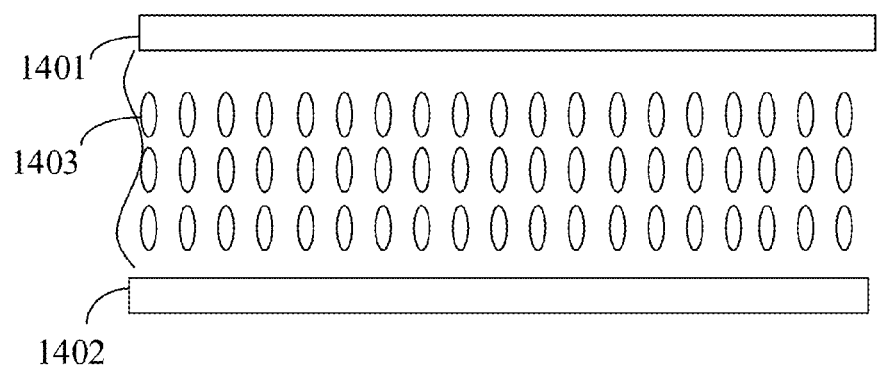
FIG. 13 is a schematic structural view of the liquid crystal display apparatus in the preferred embodiment.

The invention further includes a liquid crystal display. As illustrated in FIG. 13, FIG. 13 is a schematic structural view of the liquid crystal display apparatus in the preferred embodiment. The liquid crystal display includes an array substrate 1301 and a color filter substrate 1302 formed opposite to each other and a crystal layer 1303 formed between the array substrate 1301 and the color filter substrate 1302 wherein the array substrate 1301 further includes the GOA circuits described in the embodiments in this invention and without repeating.

To make a difference with the conventional technology, the array substrate in the liquid crystal display of this invention includes a GOA circuit. The GOA circuit includes an electrical potential pull-down controlling circuit connected to the STV signal to pull-down the electrical potential of the common signal point P to a low electrical level when STV signal output a low electrical level signal to effectively solve the maintain problem from the two bootstrap capacitors by the operation of the GOA circuit. The electrical potential pull-down controlling circuit of this embodiment further including a first voltage limited transistor PTX, and a second filter transistor PTY each connected in series. The negative static electricity of the STV signal can be filtered by the first voltage limited transistor PTX and lower the electrical level of the negative static electricity. The positive static electricity of the STV signal can be filtered by the second filter transistor PTY. By the accompanying of the first voltage limited transistor PTX, and the second filter transistor PTY, the voltage into the gate of the third transistor PTN is lower to effectively avoid the damage to the third transistor PTN from the large static electricity from the STV signal, and avoid the damage to the GOA sub circuit from the large static electricity from the STV signal through the third transistor PTN to the GOA sub circuit, and increase the stability of the GOA circuit.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present invention has been explained above, it is not the limitation of the range, the sequence in practice, the material in practice, or the method in practice. Any modification or decoration for present invention is not detached from the spirit and the range of such.

What is claimed is:

1. A GOA circuit for liquid crystal display, the GOA circuit comprising:
an electrical potential pull-down controlling circuit and a plurality of GOA sub circuits in cascade connection; and
the electrical potential pull-down controlling circuit comprising a first voltage limited transistor, a second filter transistor and a third transistor, wherein the first voltage limited transistor and the second filter transistor are connected in series and between an output terminal of an initial scanning signal that is the STV signal, and a control terminal of the third transistor, a control terminal of the first voltage limited transistor and a first terminal of the third transistor are connected to the first power terminal, a second terminal of the first voltage limited transistor is directly connected to the control terminal of the third transistor, and a second terminal of the third transistor is connected to the GOA sub circuit;
wherein the first terminal of the second filter transistor is separately connected to the control terminal and the output terminal of the STV signal, and the second terminal of the second filter transistor is connected to the first terminal of the first voltage limited transistor; and
wherein the first voltage limited transistor, the second filter transistor and the third transistor are PMOS transistors, the first terminal of the first voltage limited transistor is source, the second terminal is drain; the first terminal of the second filter transistor is source, the second terminal is drain; and the first terminal of the third transistor is source and the second terminal is drain.

2. The GOA circuit according to claim 1, wherein the first voltage limited transistor, the second filter transistor and the third transistor are NTFT transistors, the first terminal of the first voltage limited transistor is drain, the second terminal is source; the first terminal of the second filter transistor is drain, the second terminal is source; and the first terminal of the third transistor is drain and the second terminal is source.

3. The GOA circuit according to claim 1, wherein the electrical potential pull-down controlling circuit further comprising a fourth transistor, the first terminal of the fourth transistor is connected to the second terminal of the third transistor, the control terminal of the fourth transistor is connected to the first terminal of the fourth transistor, the second terminal of the fourth transistor is connected to the GOA sub circuit, wherein the type of the fourth transistor and the third transistor is the same.

4. The GOA circuit according to claim 2, wherein the electrical potential pull-down controlling circuit further comprising a fourth transistor, the first terminal of the fourth transistor is connected to the second terminal of the third transistor, the control terminal of the fourth transistor is connected to the first terminal of the fourth transistor, the second terminal of the fourth transistor is connected to the GOA sub circuit, wherein the type of the fourth transistor and the third transistor is the same.

5. The GOA circuit according to claim 1, wherein the electrical potential pull-down controlling circuit further comprising a fourth transistor, the first terminal of the fourth transistor is connected to the first power terminal, the control terminal of the fourth transistor is connected to the first terminal of the fourth transistor, the second terminal of the fourth transistor is connected to the first terminal of the third transistor, wherein the type of the fourth transistor and the third transistor is the same.

6. The GOA circuit according to claim 2, wherein the electrical potential pull-down controlling circuit further comprising a fourth transistor, the first terminal of the fourth transistor is connected to the first power terminal, the control terminal of the fourth transistor is connected to the first terminal of the fourth transistor, the second terminal of the fourth transistor is connected to the first terminal of the third transistor, wherein the type of the fourth transistor and the third transistor is the same.

7. The GOA circuit according to claim 1, wherein the first terminal of the first voltage limited transistor is connected to the output terminal of the STV signal, the second terminal of the first voltage limited transistor is connected to the first terminal of the second filter transistor, the control terminal of the second filter transistor is connected to the first terminal of the second filter transistor, and the second terminal of the second filter transistor is connected to the control terminal of the third transistor.

8. The GOA circuit according to claim 1, wherein the second terminal of the third transistor of the electrical potential pull-down controlling circuit is connected to the third level GOA sub circuit to the last level GOA sub circuit separately.

9. The GOA circuit according to claim 1, wherein the GOA circuit comprising a plurality of the electrical potential pull-down controlling circuit, each second terminal of the third transistor of each of the electrical potential pull-down controlling circuit is connected to the third level GOA sub circuit to the last level GOA sub circuit separately.

10. A liquid crystal display having an array substrate, a color filter substrate and a liquid crystal layer formed between the array substrate and the color filter, wherein the array substrate having a GOA circuit, the GOA circuit comprising:
an electrical potential pull-down controlling circuit and a plurality of GOA sub circuits in cascade connection; and
the electrical potential pull-down controlling circuit comprising a first voltage limited transistor, a second filter transistor and a third transistor, wherein the first voltage limited transistor and the second filter transistor are connected in series and between an output terminal of an initial scanning signal that is the STV signal, and a control terminal of the third transistor, a control terminal of the first voltage limited transistor and a first terminal of the third transistor are connected to the first power terminal, a second terminal of the first voltage limited transistor is directly connected to the control terminal of the third transistor, and a second terminal of the third transistor is connected to the GOA sub circuit;
wherein the first terminal of the second filter transistor is separately connected to the control terminal and the output terminal of the STV signal, and the second terminal of the second filter transistor is connected to the first terminal of the first voltage limited transistor;
wherein the first voltage limited transistor, the second filter transistor and the third transistor are PMOS transistors, the first terminal of the first voltage limited transistor is source, the second terminal is drain; the first terminal of the second filter transistor is source, the second terminal is drain; and the first terminal of the third transistor is source and the second terminal is drain.

11. The liquid crystal display according to claim 10, wherein the first voltage limited transistor, the second filter transistor and the third transistor are NTFT transistors, the first terminal of the first voltage limited transistor is drain, the second terminal is source; the first terminal of the second filter transistor is drain, the second terminal is source; and the first terminal of the third transistor is drain and the second terminal is source.

12. The liquid crystal display according to claim 10, wherein the electrical potential pull-down controlling circuit further comprising a fourth transistor, the first terminal of the fourth transistor is connected to the second terminal of the third transistor, the control terminal of the fourth transistor is connected to the first terminal of the fourth transistor, the second terminal of the fourth transistor is connected to the GOA sub circuit, wherein the type of the fourth transistor and the third transistor is the same.

13. The liquid crystal display according to claim 11, wherein the electrical potential pull-down controlling circuit further comprising a fourth transistor, the first terminal of the fourth transistor is connected to the second terminal of the third transistor, the control terminal of the fourth transistor is connected to the first terminal of the fourth transistor, the second terminal of the fourth transistor is connected to the GOA sub circuit, wherein the type of the fourth transistor and the third transistor is the same.

14. The liquid crystal display according to claim 10, wherein the electrical potential pull-down controlling circuit further comprising a fourth transistor, the first terminal of the fourth transistor is connected to the first power terminal, the control terminal of the fourth transistor is connected to the first terminal of the fourth transistor, the second terminal of the fourth transistor is connected to the first terminal of the third transistor, wherein the type of the fourth transistor and the third transistor is the same.

15. The liquid crystal display according to claim 11, wherein the electrical potential pull-down controlling circuit further comprising a fourth transistor, the first terminal of the fourth transistor is connected to the first power terminal, the control terminal of the fourth transistor is connected to the first terminal of the fourth transistor, the second terminal of the fourth transistor is connected to the first terminal of the third transistor, wherein the type of the fourth transistor and the third transistor is the same.

16. The liquid crystal display according to claim 10, wherein the first terminal of the first voltage limited transistor is connected to the output terminal of the STV signal, the second terminal of the first voltage limited transistor is connected to the first terminal of the second filter transistor, the control terminal of the second filter transistor is connected to the first terminal of the second filter transistor, and the second terminal of the second filter transistor is connected to the control terminal of the third transistor.

* * * * *